United States Patent [19]

Okabe et al.

[11] 4,213,140
[45] Jul. 15, 1980

[54] INSULATED-GATE SEMICONDUCTOR DEVICE

[75] Inventors: Takeaki Okabe, Kokubunji; Isao Yoshida, Tokyo; Mineo Katsueda, Kokubunji; Hidefumi Ito; Masatomo Furumi, both of Takasaki; Shikayuki Ochi, Akishima, all of Japan

[73] Assignee: Hitachi, Ltd., Tokyo, Japan

[21] Appl. No.: 922,371

[22] Filed: Jul. 6, 1978

[30] Foreign Application Priority Data

Jul. 22, 1977 [JP] Japan ................................ 52-87396

[51] Int. Cl.² ........................................... H01L 27/07
[52] U.S. Cl. ..................................... 357/41; 357/23; 307/251
[58] Field of Search ........................... 357/23, 41, 42; 307/251

[56] References Cited

U.S. PATENT DOCUMENTS 4,074,151  2/1978  Buckley et al. ..................... 307/251

Primary Examiner—Edward J. Wojciechowicz
Attorney, Agent, or Firm—Craig and Antonelli

[57] ABSTRACT

An insulated-gate semiconductor device wherein a first region is formed in the surface of a semiconductor substrate, the first region having a conductivity type opposite to that of the substrate, two insulated-gate FET's are formed within the first region, the drain of the first insulated-gate FET and that of the second insulated-gate FET are made common, the drains are electrically connected to the first region, and the gate of the first insulated-gate FET and the source of the second insulated-gate FET, and the gate of the second insulated-gate FET and the source of the first insulated-gate FET are respectively connected, thereby to prevent the occurrence of a negative resistance.

16 Claims, 10 Drawing Figures

INSULATED-GATE SEMICONDUCTOR DEVICE

BACKGROUND OF THE INVENTION

1. Field of the Invention

This invention relates to an insulated-gate semiconductor device, and more particularly to an insulated-gate semiconductor device which is effective as a protective device for the insulated gate of an insulated-gate FET.

2. Description of the Prior Art

Several expedients have heretofore been proposed as protective devices for protecting the insulated gate of an insulated-gate FET from electrostatic breakdown etc. Most generally used among the expedients is a diode assembly of the back-to-back structure of the pnp-type or npn-type which is respectively used for the n-channel or p-channel insulated-gate FET. However, in the case where the inverse connected diodes are of the npn-type, a parasitic npn-type transistor turns "on," and a negative resistance occurs in the voltage—current characteristic of the protective device, so that the device becomes astable.

BRIEF SUMMARY OF THE INVENTION

This invention has for its object to provide an insulated-gate semiconductor device which does not undergo any negative resistance and which is stable at all times.

Another object of this invention is to provide an insulated-gate semiconductor device which is excellent as a protective device for the insulated gate of an insulated-gate FET.

In order to accomplish such objects, this invention provides an insulated-gate semiconductor device of a construction wherein a first region which has a conductivity type opposite to that of a semiconductor substrate is formed in the surface of the substrate, two insulated-gate FET's are formed within the first region, the drain of the first insulated-gate FET as well as that of the second insulated-gate FET and the first region are electrically connected, and the gate of the first insulated-gate FET and the source of the second insulated-gate FET, and the gate of the second insulated-gate FET and the source of the first insulated-gate FET are respectively connected.

Further, in the above construction, this invention provides a structure wherein the drain of the first insulated-gate FET and that of the second insulated-gate FET are made common. The feature of the above construction, that two insulated-gate FET's are formed within the first region, includes both a case where an impurity region to serve as the source of one insulated-gate FET lies entirely within the first region and a case where it contacts with at least part of the boundary between the first region and the semiconductor substrate.

DESCRIPTION OF THE PREFERRED EMBODIMENTS

Figure 1A:
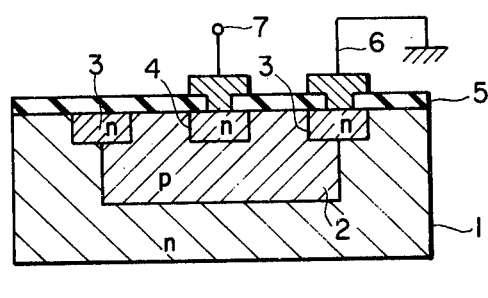
FIGS. 1A and 1B are a sectional view and a plan view, respectively, showing a back-to-back diode assembly which is conventional as a protective device for an insulated-gate FET.
Figure 1B:
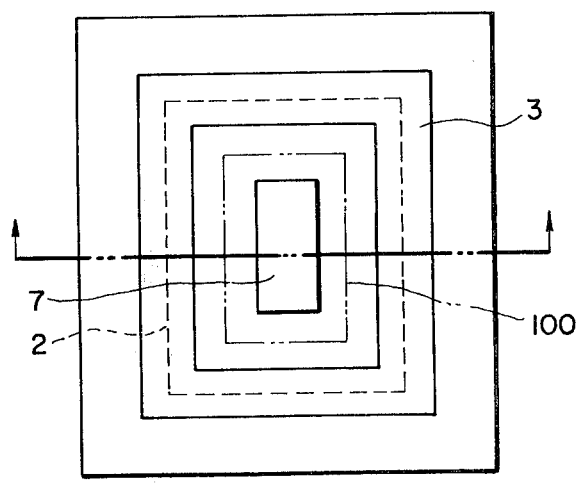

FIGS. 1A and 1B show a protective device which is an example of a prior-art insulated-gate protective device and which consists of the npn-type diodes connected inversely to each other as stated previously. Referring to the figures, numeral 1 designates an n-type substrate, numeral 2 a p-type region, and numerals 3 and 4 n-type regions. Numeral 5 indicates a film of an insulator such as $SiO_2$. Numerals 6 and 7 indicate electrode terminals (the expression "electrode terminal" shall signify an electrode and an interconnection spliced thereto). The electrode terminal 6 is connected to the ground, while the electrode terminal 7 is connected to the gate electrode of an insulated-gate FET of the p-channel type to be protected.

Figure 3:
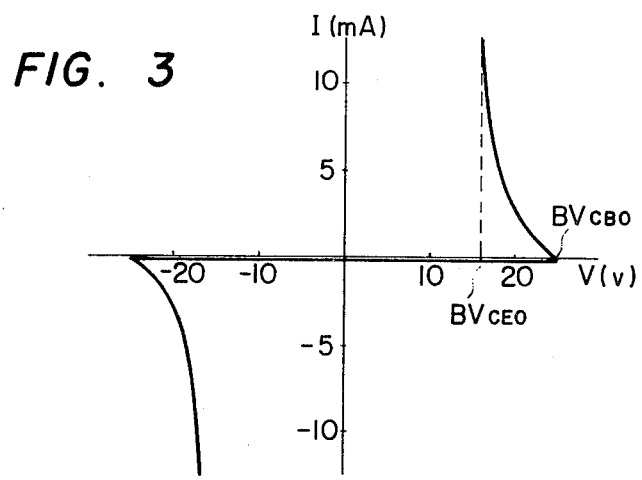
FIG. 3 is a graph showing a voltage—current characteristic of the structure illustrated in FIGS. 1A and 1B, FIGS. 4A and 4B are a sectional view and a plan view, respectively, showing an embodiment of this invention.

When, in this structure, a positive voltage is applied to the electrode terminal 7, the pn-junction between the regions 2 and 4 is reverse biased. As illustrated in FIG. 3, when the breakdown voltage $BV_{CBO}$ of the junction is reached, a current begins to flow. In this structure, however, a parasitic transistor exists, the collector of which is the n-type region 4, the base of which is the p-type region 2 and the emitter of which is made up of the n-type substrate 1 and the n-type region 3. When a negative voltage is applied to the electrode terminal 7, the circumstances are quite the same except that the pn-junction which is reverse biased is one between the p-type region 2 and the n-type substrate 1 as well as the n-type region 3 and that the emitter of the parasitic transistor is the n-type region 4, while the collector is made up of the n-type substrate 1 and the n-type region 3.

Figure 2:
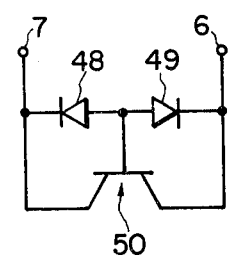
FIG. 2 is a diagram showing an equivalent circuit of the structure shown in FIGS. 1A and 1B.

FIG. 2 shows an equivalent circuit of the prior art illustrated in FIGS. 1A and 1B. Numerals 48 and 49 denote inverse-connected diodes, respectively, and numeral 50 denotes a parasitic transistor. Under the influence of the parasitic transistor 50, a negative resistance appears in the breakdown region of the voltage—current characteristic. The voltage—current characteristic of the structure of FIGS. 1A and 1B as illustrated in FIG. 3 corresponds to a case where the length of a two-dot chain line in FIG. 1B is 1.8 mm. In the graph of FIG. 3, V designates the voltage which is applied to the terminal 7, and I the current which flows between the terminals 7 and 6. As is apparent from the figure, the negative resistance occurs when the reverse current, i.e., breakdown current is less than several $\mu A$. The value of $BV_{CEO}$ in the figure is expressed by:

$$BV_{CEO} = BV_{CBO}/n\sqrt{h_{fe}}$$

where $h_{fe}$ indicates the current gain of the parasitic transistor 50, and n has a value of 1.5–4 ordinarily.

Such a negative resistance becomes a cause for instability, and is unfavorable for circuit packaging.

Hereunder, embodiments of this invention will be described in detail with reference to the drawings.

Figure 4A:
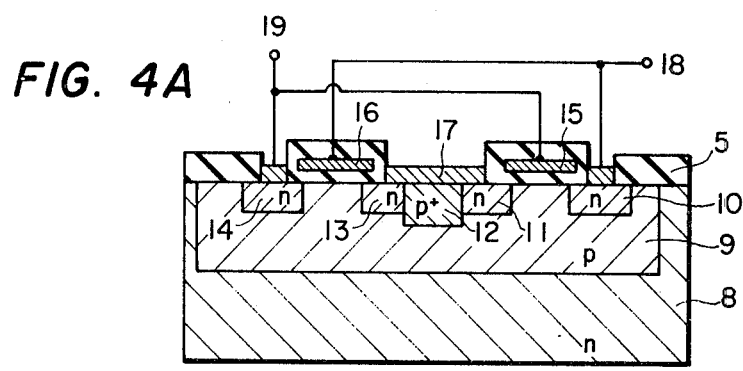
Figure 4B:
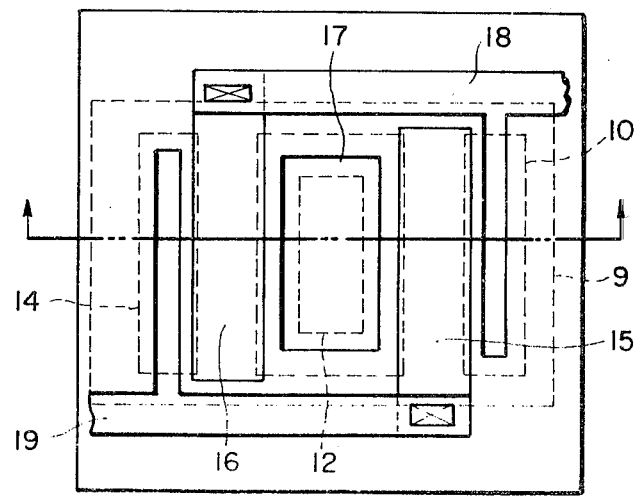

FIGS. 4A and 4B show an embodiment of this invention. FIG. 4A is a sectional constructional view of the embodiment, while FIG. 4B is a plan view thereof. Referring to the figures, numeral 8 designates an n-type substrate, and numeral 9 a p-type region. All regions 10, 11, 13 and 14 are n-type regions. Numeral 12 indicates a highly doped p-type region. Numerals 15 and 16 indicate gate electrodes of two insulated-gate FET's. Numerals 17, 18 and 19 represent electrodes or electrode terminals which are formed of, e.g., Al (the expression "electrode terminal" shall include an electrode and an interconnection spliced thereto). Although, in the illustration, the n-type regions 11 and 13 are formed of an identical region within the semiconductor substrate, they may well be separate regions. As apparent from the figures, in the present embodiment, two insulated-gate FET's are formed in the p-type region 9 (hereinafter, the FET on the left side of FIG. 4A shall be termed "$Q_1$," and the FET on the right side "$Q_2$"). The n-type regions 13 and 11 which are the drains of the respective FET's $Q_1$ and $Q_2$ are electrically connected to the p-type region 9. The n-type region 14 being the source of the FET $Q_1$ and the gate electrode 15 of the FET $Q_2$, and the n-type region 10 being the source of the FET $Q_2$ and the gate electrode 16 of the FET $Q_1$ are respectively connected. The $p^+$-type region 12 serves to electrically connect the p-type region 9 and the n-type regions 11, 13 through the electrode 17. In case where the electrode terminal 18 is grounded, the n-type region 10 may be formed in contact with at least part of the substrate surface at the boundary between the p-type region 9 and the n-type substrate 8 as seen from an embodiment to be described later.

Figure 5:
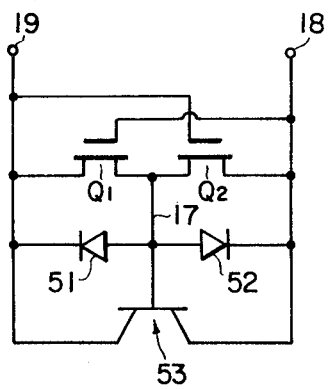
FIG. 5 is a diagram showing an equivalent circuit of the structure of FIGS. 4A and 4B.

An equivalent circuit of the present structure in FIGS. 4A and 4B becomes as shown in FIG. 5. Referring to this figure, numeral 51 designates a pn-junction diode which is formed of the n-type region 14 and the p-type region 9, numeral 52 a pn-junction diode which is formed of the n-type region 10 and the p-type region 9, and numeral 53 a parasitic transistor which is formed of the n-type substrate 8, the p-type region 9 and the n-type regions 10, 14.

The operation of the present structure will be described on the assumption that the electrode terminal 19 is connected to the gate electrode of a p-channel insulated-gate FET to be protected and that the electrode terminal 18 is connected to the ground. When a positive voltage is applied to the electrode 19, it is impressed on the gate electrode 15, so that the FET $Q_2$ turns "on." Between the electrodes 19 and 18, accordingly, only the np-junction defined by the n-type region 14 and the p-type region 9 is reverse biased. Even when a breakdown current flows through this np-junction, the parasitic transistor 53 whose collector, base and emitter are the n-type region 14, p-type region 9 and n-type substrate 8 respectively does not operate and accordingly any negative resistance does not occur so long as the "on" voltage of the FET $Q_2$ is held below the built-in potential (approximately 0.6 V) of the pn-junction between the p-type region 9 and the n-type substrate 8. Since the "on" voltage of the FET $Q_2$ is inversely proportional to the channel conductance thereof, it is very simple to set the above condition. When a negative voltage is applied to the electrode 19, a quite similar consideration applies because the present device is fabricated to be symmetric.

Figure 6:
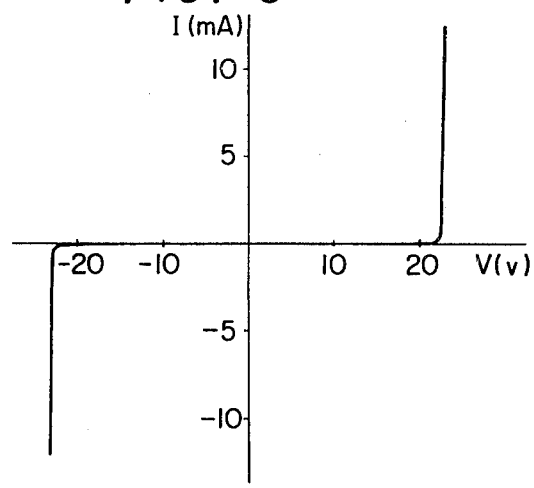
FIG. 6 is a graph showing a voltage—current characteristic of the structure of FIGS. 4A and 4B, and FIGS. 7A and 7B are a sectional view and a plan view, respectively, showing a second embodiment of this invention.

FIG. 6 shows a characteristic of the present embodiment. In the figure, V represents the voltage which is applied to the electrode 19, while I denotes the current which flows between the electrodes 19 and 18. Herein, the electrode 18 is in the grounded state. As apparent from the characteristic diagram, even when the reverse current or breakdown current exceeds 12 mA, no negative resistance is observed. At the measurement of this characteristic, the FET's $Q_1$ and $Q_2$ had quite the same construction, in which the channel width was 0.4 mm, the channel length was 7 $\mu$m and the thickness of the gate oxide ($SiO_2$) film was 130 nm.

An example of the manufacturing process of the embodiment of this invention shown in FIGS. 4A and 4B will be briefly explained. The p-type region 9 is formed in such a way that boron ions accelerated at 125 KeV are implanted into the n-type substrate 8 at a concentration of $3 \times 10^{13}$ atoms/cm$^2$, whereupon the resultant substrate is heat-treated in $N_2$ at 1,200° C. for 16 hours. At this time, the depth of the pn-junction between the p-type region 9 and the n-type substrate 8 is 9 $\mu$m. Subsequently, a thermal oxidation film which is 100–150 nm thick is formed as an insulating film underneath the gate electrodes 15 and 16. Thereafter, a polycrystalline Si film is formed in the shape of the gate electrodes 15 and 16. The n-type regions 10, 11, 13 and 14 are formed by the diffusion of phosphorus into a surface impurity concentration of $1 \times 10^{20}$ atoms/cm$^3$ and a depth of 0.8 $\mu$m. At that time, the impurity is similarly diffused into the gate electrodes 15 and 16. Subsequently, the p-type region 12 is formed by the diffusion of boron into a surface impurity concentration of $5 \times 10^{19}$ atoms/cm$^3$ and a depth of 1.2 $\mu$m. Lastly, Al metal is contacted and interconnected with the necessary parts. Thus, the structure of FIGS. 4A and 4B can be obtained.

Although polycrystalline silicon has been exemplified as the material of the gate electrodes, Al, Mo, W etc. may be employed. Likewise, although aluminum has been exemplified as the material of the electrodes 17, 18 and 19, polycrystalline Si or Mo, W etc. may be used. Further, impurities other than phosphorus and boron may be used as the n-type and p-type impurities. Still further, the formation of the n-type regions 10, 11, 13 and 14 followed by the formation of the p-type region 12 may be reversed. In addition, the formation of the gate electrodes 15 and 16 followed by the formation of the n-type regions 10, 11, 13 and 14 as well as the p-type region 12 may be reversed.

Figure 7A:
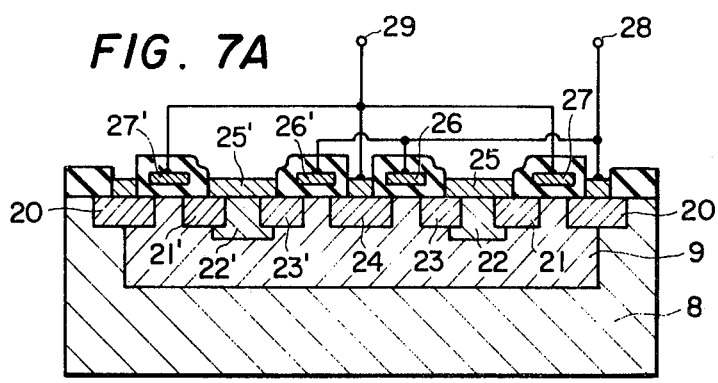
Figure 7B:
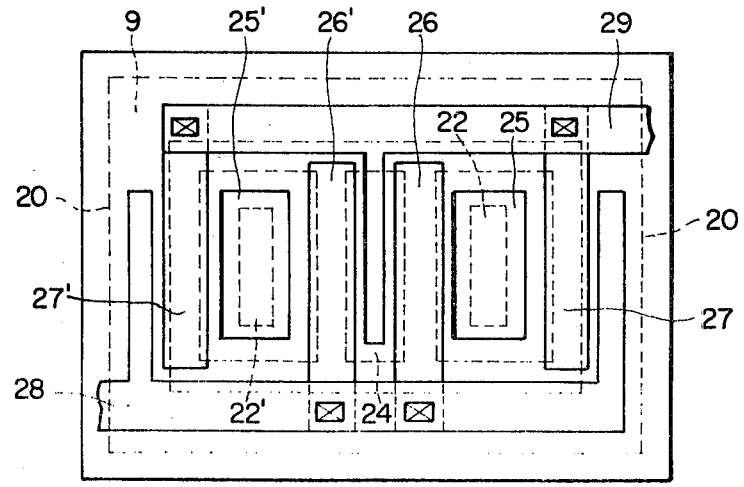

FIGS. 7A and 7B show a second embodiment of this invention wherein the devices of the embodiment in FIGS. 4A and 4B are arranged bilaterally symmetrically. In FIGS. 7A and 7B, the same numerals as in FIGS. 4A and 4B designate the same parts. Numeral 20, numerals 21 and 21', numerals 23 and 23' and numeral 24 designate n-type regions. Numerals 22 and 22' indicate $p^+$-type regions. Numerals 25 and 25' indicate Al electrodes. Numerals 26 and 26' and numerals 27 and 27' represent gate electrodes made of polycrystalline silicon. Shown at 28 and 29 are electrode terminals. The n-type region 20 is formed in the shape of a frame in contact with the boundary between the p-type region 9 and the n-type substrate 8. This serves to electrically hold the n-type substrate 8 and the n-type region 20 at an identical potential. Although, in the illustration, the n-type regions 21 and 23 and those 21' and 23' are respectively formed of the same regions, they may be formed of separate regions. Further, the n-type region 24 may be made two independent regions. In the present structure, a gate electrode to be protected is electrically connected to the electrode terminal 29, while the electrode terminal 28 is grounded. The manufacturing process of the structure of FIGS. 7A and B is similar to that of the FIGS. 4A and B embodiment.

The feature of the FIGS. 7A and B is that the upper limit of the reverse current or breakdown current at which the negative resistance does not occur can be made substantially double in comparison with the same in the FIGS. 4A and 4B embodiment. In case of the FIGS. 4A and B embodiment, since the n-type region 14 being the source of one insulated-gate FET exists in the vicinity of the boundary between the p-type region 9 and the n-type substrate 8, there is the danger that current will leak from the n-type region 14 through a surface inversion layer to the n-type substrate 8. In contrast, in case of the FIGS. 7A and B embodiment, the n-type region 24 forming the sources of a pair of insulated-gate FET's lies at the center of the p-type region 9, so that the danger is not involved at all.

This invention is not restricted to the foregoing two embodiments, but it covers all the structures falling within the scope thereof. By way of example, a plurality structures of the first or second embodiment are constructed in parallel within a single chip, whereby the occurrence of the negative resistance can be prevented up to a higher current. Needless to say, the same effects can be achieved even when the p-type impurity and the n-type impurity in the foregoing embodiments are made just opposite.

We claim:

1. An insulated-gate semiconductor device comprising a semiconductor substrate of one conductivity type, a first region which is formed in a surface of said substrate and which has a conductivity type opposite to that of said substrate, and first and second insulated-gate FET's which are formed within said region and all of which are one channel type insulated-gate FET's; a drain of said first insulated-gate FET, a drain of said second insulated-gate FET and said first region being electrically connected; a gate of said first insulated-gate FET and a source of said second insulated-gate FET being electrically connected; a gate of said second insulated-gate FET and a source of said first insulated-gate FET being electrically connected.

2. An insulated-gate semiconductor device according to claim 1, wherein said drain of said first insulated-gate FET and said drain of said second insulated-gate FET are formed of a single region which is formed in the surface of said semiconductor substrate within said first region and which has the same conductivity type as that of said semiconductor substrate.

3. An insulated-gate semiconductor device according to claim 2, wherein a region which extends from the surface of said semiconductor substrate to said first region and which has the same conductivity type as that of said first region is formed, and this region and said single region having the same conductivity as that of said semiconductor substrate are electrically connected by an electrode which is formed on the surface of said semiconductor substrate.

4. An insulated-gate semiconductor device according to claim 3, wherein said region having the same conductivity type as that of said first region is formed within said single region having the same conductivity type as that of said semiconductor substrate.

5. An insulated-gate semiconductor device according to claim 1, wherein a region which is said source of said first insulated-gate FET and which has the same conductivity type as that of said semiconductor substrate is formed in contact with at least part of a boundary between said first region and said semiconductor substrate.

6. An insulated-gate semiconductor device according to claim 1, 2, 3, 4 or 5, wherein the conductivity type of said semiconductor substrate is the n-type.

7. An insulated-gate semiconductor device according to claim 6, wherein the source of said second insulated-gate FET is connected to a gate electrode of a p-channel insulated-gate FET which is formed at a different position on the surface of said semiconductor substrate, and the source of said first insulated-gate FET is connected to the earth potential.

8. An insulated-gate semiconductor device comprising a semiconductor substrate of one conductivity type, a first region which is formed in a surface of said substrate and which has a conductivity type opposite to that of said substrate, and first, second, third and fourth insulated-gate FET's which are formed within said region and all of which are one channel type insulated-gate FET's; a drain of said first insulated-gate FET, a drain of said second insulated-gate FET and said first region being electrically connected; a drain of said third insulated-gate FET, a drain of said fourth insulated-gate FET and said first region being electrically connected; gates of said first and fourth insulated-gate FET's and sources of said second and third insulated-gate FET's being electrically connected; gates of said second and third insulated-gate FET's and sources of said first and fourth insulated-gate FET's being electrically connected.

9. An insulated-gate semiconductor device according to claim 8, wherein said drain of said first insulated-gate FET and said drain of said second insulated-gate FET, and said drain of said third insulated-gate FET and said drain of said fourth insulated-gate FET are respectively formed of a single region which is formed in the surface of said semiconductor substrate within said first region and which has the same conductivity type as that of said semiconductor substrate.

10. An insulated-gate semiconductor device according to claim 9, wherein two regions which extend from the surface of said semiconductor substrate to said first region and which have the same conductivity type as that of said first region are formed, and each of said two regions is electrically connected to said single region having the same conductivity type as that of said semiconductor substrate, by an electrode which is formed on the surface of said semiconductor substrate.

11. An insulated-gate semiconductor device according to claim 8, wherein said sources of said second and third insulated-gate FET's are formed of a single region which has the same conductivity type as that of said semiconductor substrate.

12. An insulated-gate semiconductor device according to claim 8, wherein said sources of said first and fourth insulated-gate FET's are formed of a single region which has the same conductivity type as that of said semiconductor substrate.

13. An insulated-gate semiconductor device according to claim 12, wherein said single region is formed in contact with at least part of a boundary between said first region and said semiconductor substrate.

14. An insulated-gate semiconductor device according to claim 8, 9, 10, 11, 12 or 13, wherein the conductivity type of said semiconductor substrate is the n-type.

15. An insulated-gate semiconductor device according to claim 14, wherein said sources of said second and third insulated-gate FET's are electrically connected to a gate electrode of at least one p-channel insulated-gate FET which is formed at a different position on the surface of said semiconductor substrate, and said sources of said first and fourth insulated-gate FET's are connected to the earth potential.

16. In an insulated-gate semiconductor device comprising a substrate of one conductivity type, a first region which is formed in a surface of said substrate and which has a conductivity type opposite to that of said substrate, and first and second insulated-gate FET's which are formed within said region and all of which are one channel type insulated-gate FET's, each having a source, drain and gate, said device including a parasitic transistor which, during its conduction, introduces a negative resistance in the voltage-current characteristic of the said device, the improvement comprising:

means to electrically couple a drain of each of the first and second FET's and said region, and to electrically couple a gate of said first insulated-gate FET and a source of said second insulated-gate FET, and to electrically couple a gate of said second insulated-gate FET and a source of said first insulated-gate FET to prevent conduction in said parasitic transistor.

* * * * *